United States Patent
Zhuang et al.

(10) Patent No.: US 10,484,167 B2
(45) Date of Patent: Nov. 19, 2019

(54) CIRCUIT FOR AND METHOD OF RECEIVING A SIGNAL IN AN INTEGRATED CIRCUIT DEVICE

(71) Applicant: Xilinx, Inc., San Jose, CA (US)

(72) Inventors: Yi Zhuang, San Jose, CA (US); Winson Lin, San Francisco, CA (US); Jinyung Namkoong, San Jose, CA (US); Hsung Jai Im, San Jose, CA (US); Stanley Y. Chen, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 15/920,251

(22) Filed: Mar. 13, 2018

(65) Prior Publication Data

US 2019/0288830 A1    Sep. 19, 2019

(51) Int. Cl.
| | |
|---|---|
| H04L 7/00 | (2006.01) |
| H04L 7/033 | (2006.01) |
| G06F 1/06 | (2006.01) |
| H03K 19/0175 | (2006.01) |
| H03K 19/20 | (2006.01) |

(52) U.S. Cl.
CPC .............. *H04L 7/0331* (2013.01); *G06F 1/06* (2013.01); *H03K 19/017509* (2013.01); *H04L 7/0025* (2013.01); *H04L 7/0087* (2013.01); *H03K 19/20* (2013.01)

(58) Field of Classification Search
CPC ....... H04L 7/0331; H04L 7/0025; G06F 1/06; H03K 19/017509
See application file for complete search history.

(56) References Cited

U.S. PATENT DOCUMENTS

| | | |
|---|---|---|
| 6,504,415 B1 | 1/2003 | Robinson et al. |
| 6,538,499 B1 | 3/2003 | Lu |
| 6,600,355 B1 | 7/2003 | Nguyen |
| 6,614,318 B1 | 9/2003 | Boecker |
| 6,664,837 B1 | 12/2003 | Oh et al. |
| 6,812,872 B1 | 11/2004 | Lu |
| 6,847,246 B1 | 1/2005 | Kaviani et al. |
| 6,983,394 B1 | 1/2006 | Morrison et al. |
| 7,142,823 B1 | 11/2006 | Logue et al. |
| 7,505,542 B1 | 3/2009 | Lesea |
| 7,509,608 B1 | 3/2009 | Duong |

(Continued)

OTHER PUBLICATIONS

Rodini et al. A 5.75 to 44 Gb/s Quarter Rate CDR with Data Rate Selection in 90 nm Bulk CMOS, IEEE Journal of Solid-State Circuits, IEEE Service Center, Piscataway, NJ, USA, vol. 44, No. 7, Jul. 1, 2009 (Jul. 1, 2009), pp. 1927-1941.

*Primary Examiner* — Syed Haider
(74) *Attorney, Agent, or Firm* — John J. King

(57) ABSTRACT

A circuit for receiving a signal in an integrated circuit is described. The circuit comprises a sampler configured to receive an input data signal, wherein the sampler generates sampled data and a recovered clock; a clock and data recovery circuit configured to receive the sampled data and the recovered clock and to generate a phase interpolator code; and a phase interpolator configured to receive the phase interpolator code; wherein the phase interpolator generates multiple phase interpolator control signals during a clock cycle based upon the phase interpolator code generated for the clock cycle.

20 Claims, 7 Drawing Sheets

(56) References Cited

U.S. PATENT DOCUMENTS

| | | |
|---|---|---|
| 7,673,267 B1 | 3/2010 | Duong |
| 7,864,834 B1 | 1/2011 | Wu |
| 8,005,181 B1 | 8/2011 | Steiner |
| 8,258,845 B1 | 9/2012 | Alexander et al. |
| 8,966,432 B1 | 2/2015 | Klein |
| 9,088,399 B1 | 7/2015 | Poon et al. |
| 2003/0086339 A1* | 5/2003 | Daily ................... H03L 7/0814 368/202 |
| 2006/0133557 A1 | 6/2006 | Freyman et al. |
| 2006/0133558 A1* | 6/2006 | Swartz ................. H03L 7/0812 375/371 |
| 2007/0047683 A1* | 3/2007 | Okamura ............. H03L 7/0814 375/355 |
| 2015/0229298 A1* | 8/2015 | Tomita ...................... H03L 7/07 375/376 |
| 2015/0326255 A1* | 11/2015 | Dally ....................... H03K 3/45 375/297 |
| 2017/0187361 A1 | 6/2017 | Tai et al. |
| 2018/0152190 A1* | 5/2018 | Song ........................ H03L 7/07 |

\* cited by examiner

CIRCUIT FOR AND METHOD OF RECEIVING A SIGNAL IN AN INTEGRATED CIRCUIT DEVICE

TECHNICAL FIELD

The present invention relates generally to integrated circuit devices, and in particular, to a circuit for and method of receiving a signal in an integrated circuit device.

BACKGROUND

Data transmission is an important operation performed by many integrated circuit devices. A phase interpolator is often used to receive data signals, where different phases of a clock signal are used to sample data of a received data stream. The changing of a phase of a clock signal used by the phase interpolator of a receiver to receive data signals may cause output period jitter. Such jitter may be a particular problem in a glitch-sensitive complementary metal oxide semiconductor (CMOS) phase interpolator (PI) device. In data transmission where a clock signal is not sent with the data, a clock recovery circuit is used on the receiving side to derive a clock signal from the incoming data. The phase of the clock signal needs to track any movement in data edges. A clock phase interpolator is often utilized for this purpose. The clock phase interpolator can generate an arbitrary clock phase based on an input digital code. When this code changes, the output clock phase should move. The code may jump by many code steps at a time, often resulting in the output clock having more extended big period jitter than expected.

Circuits and methods for improving the operation of a phase interpolator, such as by reducing jitter, in receiving data are beneficial.

SUMMARY

A circuit for receiving a signal in an integrated circuit is described. The circuit comprises a sampler configured to receive an input data signal, wherein the sampler generates sampled data and a recovered clock; a clock and data recovery circuit configured to receive the sampled data and the recovered clock and to generate a phase interpolator code; and a phase interpolator configured to receive the phase interpolator code; wherein the phase interpolator generates multiple phase interpolator control signals during a clock cycle based upon the phase interpolator code generated for the clock cycle.

A method of receiving a signal in an integrated circuit is also described. The method comprises receiving an input data signal; generating sampled data and a recovered clock based upon the input data signal; generating a phase interpolator code based upon the sampled data and the recovered clock; receiving the phase interpolator code at a phase interpolator; and generating multiple phase interpolator control signals during a clock cycle based upon the phase interpolator code generated for the clock cycle.

DETAILED DESCRIPTION

The circuits and methods of the present invention reduce glitches in a phase interpolator of a receiver by generating multiple phase interpolator control signals during a clock cycle based upon a phase interpolator code generated for the clock cycle. According to one implementation, the circuits and methods reduce the step size of changes in a clock and data recovery (CDR) code to more gradually change the CDR code, and therefore minimize any glitches. By way of example, the step size could be reduced by changing a CDR code used by a phase interpolator at both the rising edge and the falling edge of a clock signal. According to another method, a CDR code could be selected based upon a detected boundary crossing. For example, a current code and a next code could be compared to identify a boundary crossing, where the CDR code is changed during the middle of a clock cycle based upon a detected boundary crossing.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
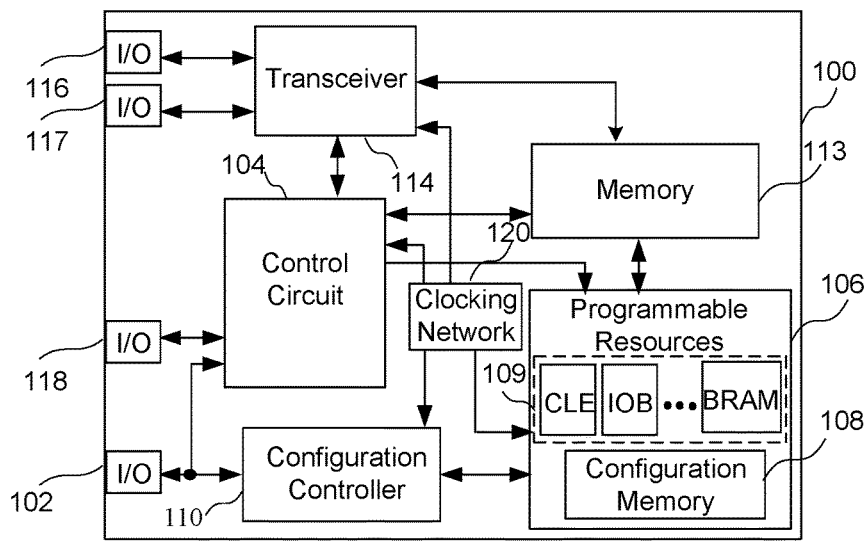
FIG. 1 is a block diagram of an integrated circuit having a receiver circuit.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may comprise a receiver to receive signals at the integrated circuit by way of I/O ports 116 and 117 as described below. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods as described in more detail below could be implemented to receive data using the circuit of FIG. 1, for example.

Figure 2:
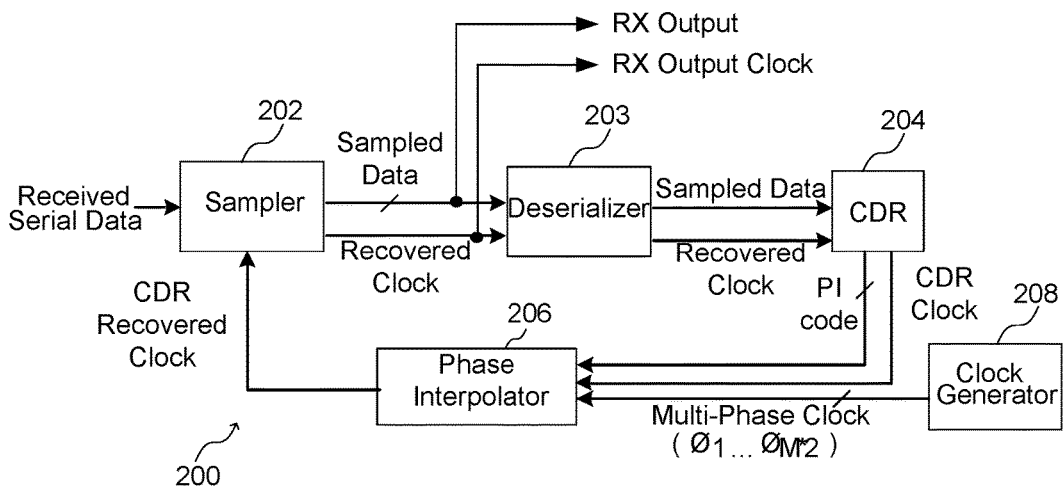
FIG. 2 is a block diagram of a receiver circuit that may be implemented in FIG. 1.

Turning now to FIG. 2, a block diagram of a receiver circuit 200 that may be implemented in the transceiver circuit 114 of FIG. 1 is shown. The receiver circuit 200 comprises a sampler 202 that is configured to receive and sample data of a data stream, which may be a serial data stream for example. The sampler 202, which may be a capture flip-flop for example, generates sampled data, which can be output as a receiver output signal (RX Output), and a recovered clock signal, which can be a receiver output clock (RX Output Clock) signal. The sampled data and the recovered clock generated by the sampler 202 can be routed to a deserializer 203, which generates serialized sampled data and the recovered clock that are provided to the CDR circuit 204. The CDR circuit 204 generates a phase interpolator (PI) code and a CDR clock signal (CDR Clock), also known as the launching clock, that are provided to a phase interpolator 206 for generating a CDR Recovered Clock signal (CDR Recovered Clock). A multi-phase clock signal is also generated by a clock generator 208. As will be described in more detail below, different phases of the multi-phase clock signal may be selected to generate the CDR Recovered Clock.

The phase interpolator 206 is part of a receiver CDR loop to adjust the sampling phase of the sampler 202, in order to recover data and a clock from the received signal. As shown in FIG. 2, the phase interpolator 206 takes in multi-phases of the clock signal from the clock generator 208 and generates a sampling clock based on the N-bit binary PI code from the CDR circuit 206. The multi-phase clocks, which may be spaced evenly across 360 degrees, are selectively interpolated to achieve a phase resolution of $360/2^N$ degrees, where the number of multi-phase clocks is generally much less than $2^N$, resulting in a need for phase interpolation. An exemplary phase interpolator 206 and the generation of a sampling clock will be described in more detail in reference to FIG. 3.

Figure 3:
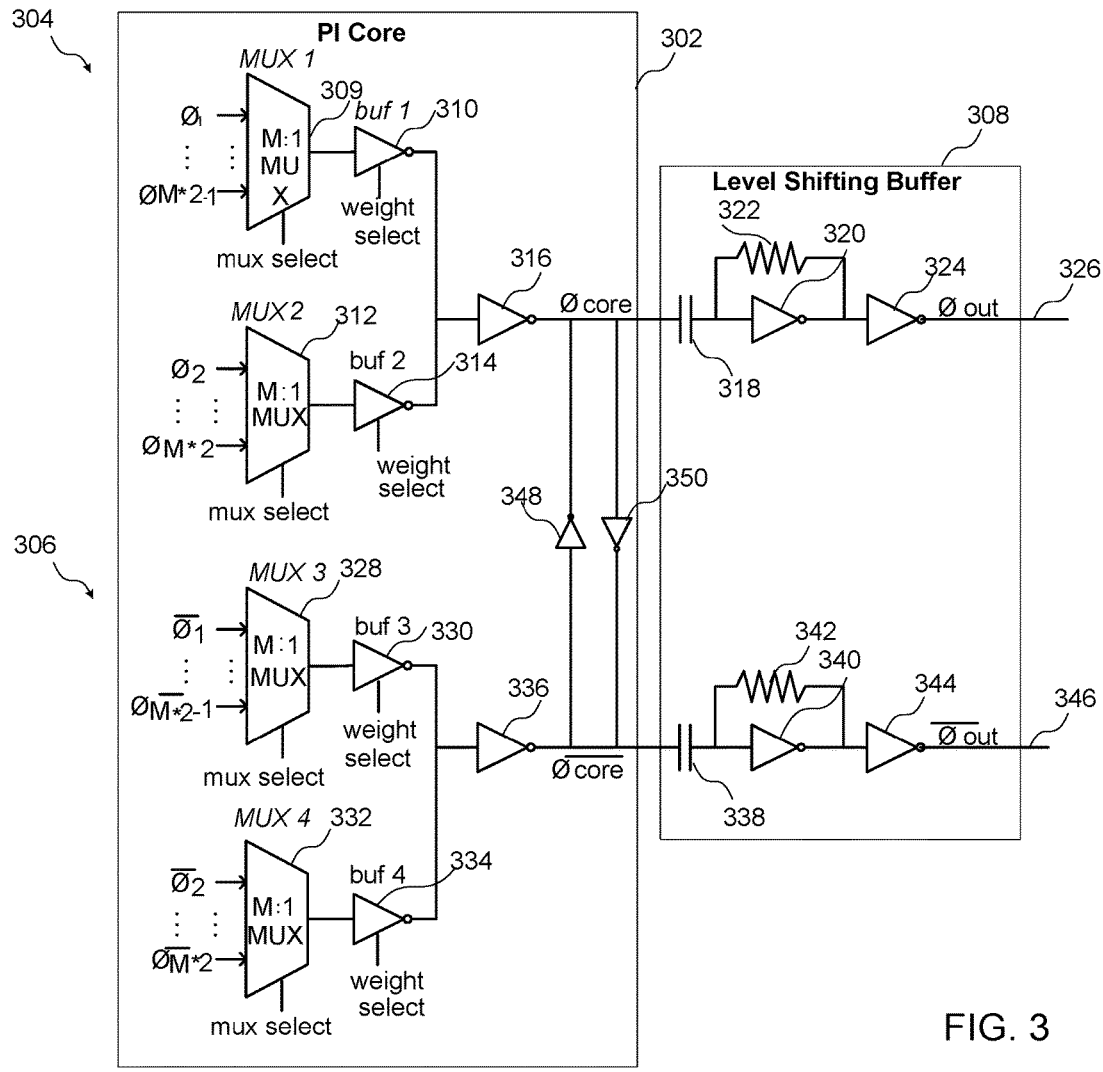
FIG. 3 is a block diagram of a portion of a phase interpolator that may be implemented in the receiver circuit of FIG. 2.

Turning now to FIG. 3, a block diagram of a portion of a phase interpolator that may be implemented in the receiver circuit of FIG. 2 is shown. A PI core 302 comprises a first phase generation circuit 304 and a second phase generation circuit 306, the outputs of which are coupled to a level shifting buffer 308. The first phase generation circuit 304 comprises a plurality of multiplexers and buffers adapted to generate a mixed output signal (Øcore), while the second phase generation circuit 306 also comprises a plurality of multiplexers and buffers adapted to generate an inverted mixed output signal (Øcore_b, indicated in FIG. 3 as having a bar over the Øcore designation). More particularly, the first phase generation circuit comprises a first multiplexer 309 (MUX 1) configured to receive odd phase signals $Ø_1$ to $Ø_{M*2-1}$ which can be selected by a first multiplexer selection signal. A first buffer 310 at the output of the multiplexer 309 is configured to receive a first weight select signal to provide a weight to the selected clock phase selected by the multiplexer. A second multiplexer 312 is coupled to receive even phase signal $Ø_2$ to $Ø_{M*2-1}$ of the clock signal and controlled by a second multiplexer selection signal, an output of which is coupled to a second buffer 314 configured to receive a second weight selection signal. The two selected and weighted clock phases are coupled to a buffer 316 that mixes the signals to generate a mixed output signal ($Ø_{CORE}$) as shown.

The output signal $Ø_{CORE}$ is provided to the level shifting buffer 308 at a first capacitor 318 that is coupled to a first buffer 320 having a resistive element 322 coupled between its input and output. The output of the first buffer 320 is coupled to a second buffer 324 that generates the output clock signal $Ø_{OUT}$ at an output 326.

The second phase generation circuit 306 also comprises a plurality of multiplexers and inverters adapted to generate a mixed output signal (Øcore_b). More particularly, the second phase generation circuit comprises a third multiplexer 328 configured to receive odd phase signals $Ø_1$ to $Ø_{M*2-1}$ which can be selected by a third multiplexer selection signal. A third buffer 330 at the output of the multiplexer 328 is configured to receive a third weight select signal to provide a weight to the selected clock phase selected by the multiplexer 328. A fourth multiplexer 332 is coupled to receive even phase signal $Theta_2$ to $Ø_{M*2-1}$ of the clock signal and controlled by a multiplexer selection signal, an output of which is coupled to a fourth buffer 334 configured to receive a fourth weight selection signal. The two selected and weighted clock phases are coupled to a buffer 336 that mixes the signals to generated an inverted mixed output signal ($Ø_{CORE\_}$b) as shown.

The output signal $Ø_{CORE\_}$b is provided to the level shifting buffer 308 at a second capacitor 338 that is coupled to a third buffer 340 having a resistive element 342 coupled between its input and output. The output of the third buffer 340 is coupled to a fourth buffer 344 that generates an inverted output clock signal $Ø_{OUT\_}$b at an output 346. Cross-coupled inverters 348 and 350 are coupled between the outputs of the buffers 316 and 336 to minimize skew between the differential signals provided to the level shifting buffer 308.

The CMOS PI circuit topology may be implemented as shown in FIG. 3, where multi-phase input clocks are successively divided into two groups and feed the two M-to-1 phase selection multiplexers (i.e. multiplexers 309 and 312). The interpolation buffers (i.e. buffers 310 and 314) mix two selected phases of the clock signal and deliver a weighted sum at the output of the PI Core as a Øcore signal. It should be noted that a level shifting buffer is needed because power supply voltage levels may be different between the PI Core and subsequent buffers. According to one implementation, the level shifting buffer circuit 308 following the PI core 302 shifts the common mode of the "mixed" signal to a CMOS signal domain and also drives the output GOUT to a full CMOS swing. The second phase generation circuit 306 (comprising multiplexers 328 and 332 and buffers 330 and 334) is for generating the differential clock signal (i.e. the inverted clock signal). One or more cross-couple invertor pairs, implemented here as inverters 348 and 350, are used at PI core output to eliminate skew between the pseudo differential signals.

Figure 4:
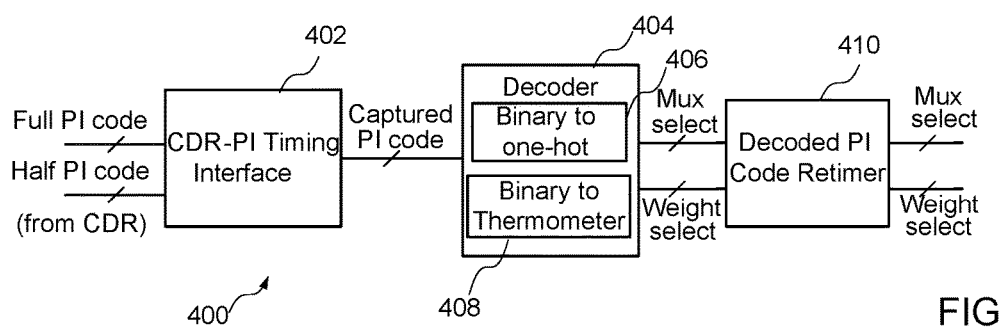
FIG. 4 is a block diagram of another portion of a phase interpolator that may be implemented in the receiver circuit of FIG. 2.

Turning now to FIG. 4, a block diagram of another portion of a phase interpolator that may be implemented in the receiver circuit of FIG. 2 is shown. More particularly, the signal generator circuit 400 of FIG. 4 is implemented to generate the multiplexer select and weight select signals used in FIG. 3. A Full PI code and a Half PI Code from the CDR circuit is coupled to a CDR-PI Timing Interface 402 to generate a captured PI code, as will be described in more detail below. The captured PI code is coupled to a decoder 404 having a binary-to-one-hot circuit 406 and a binary-to-thermometer circuit 408. A mux select signal and a weight select signal are coupled to a decoded PI code retimer circuit 410 which generates a mux select signal and a weight select signal. The decoded PI code retimer circuit 410 is implemented to reduce skew due to routing and different path delay in the decoder.

The CDR-PI timing interface 402 captures and decodes the Full and Half PI codes, which may be N-bit binary PI codes received from the CDR circuit 204 for example, before retiming it with the local CDR clock from the CDR circuit 204. The N-bit binary code is decoded and fed to the multiplexers and interpolation buffers of the PI core 302 as the MUX select and weight select signals as described above. More particularly, the multiplexer control signals are decoded by the binary-to-one-hot decoder 406, and weight select signals acting as buffer control signals are decoded by a binary-to-thermometer decoder 408 for example. The thermometer decoder is implemented to enable the phase mixer of phase interpolator in performing linear interpolation. The selected phase of the clock signal provided to the interpolation buffers are selected through the multiplexers, and the buffer weightings are controlled by enabling/disabling a portion of the buffer. It should be noted that MUX1-MUX4 controls are called "coarse" select, since they select between 0, 90, 180, and 270 degree clocks, for example, while buf1-buf4 controls are called "fine" select, because they mix between 0 and 45 degree clocks, for example. As the code is changed one step at a time, when output phase is between 0 and 45 degree, MUX1 output would be 0 degree clock, and MUX2 output would be 45 degree clock. Because the output phases are very close to 45 degree, buf2 has max weight and buf1 almost no weight. As 45 degree is crossed, the mux1 output changes from 0 degree to 90 degree. Therefore, as you rotate phase by changing 1 step at a time, coarse mux output is changed when there is almost no weight on it, and any glitch on the mux output does not propagate to the output. However, when changing by many steps, and the phase may suddenly change from middle of one octant to middle of another octant, in which case both coarse and fine controls need to change, and controlling the timing of those controls is beneficial. The number of input phases (M*2), the implementation of the interpolation buffers, and the size of each weighting unit are design factors which can be derived from design specifications, such as PI resolution or linearity for example.

Figure 5:
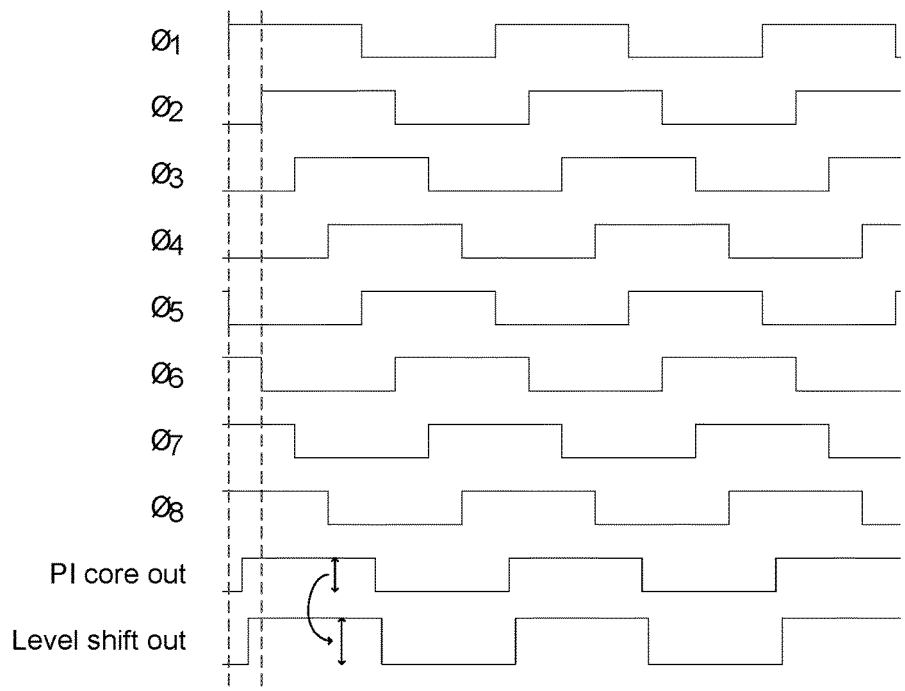
FIG. 5 is a timing diagram showing phases of a clock signal provided to a phase interpolator and a selected phase interpolator output.

Turning now to FIG. 5, a timing diagram shows phases of a clock signal provided to a phase interpolator and a selected phase interpolator output. Assuming that M=4 and N=7, 8 input phases divide a full 360 degrees of phase rotation into 8 45-degree octants (selected by 3 binary bits and shown by separation of the 2 dashed lines), where each octant is further divided into 16 steps (selected by 4 binary bits). That is, one full PI rotation consists of 128 steps and every 16 steps mark an octant boundary. An example waveform of PI core input, the PI core output, and level shifting buffer output are shown in FIG. 5, where the output level of the PI core signal is increased to generate the Level Shift Out signal as shown. Clock signal phases Ø1 to Ø8 are input to the PI and the PI core out is a result of interpolation between Ø1 and Ø2. The level shifting buffer 308 shifts the PI core output (e.g. Øcore) to a new common mode before driving the next block with the level shift out signal (e.g. Øout).

Figure 6:
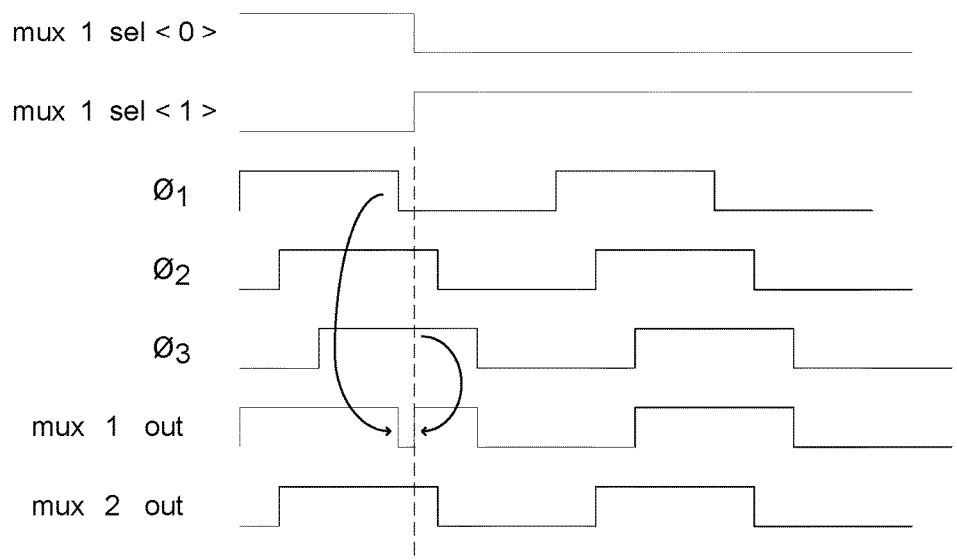
FIG. 6 is a timing diagram showing a glitch in an output multiplexer based upon a change in a selected phase of a clock signal provided to a phase interpolator.

Turning now to FIG. 6, a timing diagram shows a glitch in an output multiplexer based upon a change in a selected phase of a clock signal provided to a phase interpolator. When a phase of a clock used by a phase interpolator is changed, such as in a spread spectrum clocking (SSC) application, the PI is generally rotating in one direction with a fixed step at a fixed rate. During certain code transitions, the multiplexer input will switch from one to another to select a different clock phase for interpolation. As illustrated in FIG. 6, when the MUX 1 select signal (e.g. the select signal for multiplexer 309) toggles at the point marked by the dashed line to switch from phase Ø1 to phase Ø3, clock glitch (i.e. a short pulse) can be observed at the output of MUX 1. Assuming a small rise/fall time and fan-out, the glitch at the multiplexer output would propagate to the PI output assuming sufficient weighting of the interpolation buffer (e.g. buf 1), which in turn may present phase jitter generated by the output of the multiplexer in addition to the expected phase adjustment. Severe phase jitter would cause downstream circuits to malfunction. The reduction of period jitter can be achieved by reducing the step size for changes in the PI code, and reducing impact of clock switching to the output due to a boundary crossing, as will be described in more detail below.

Figure 7:
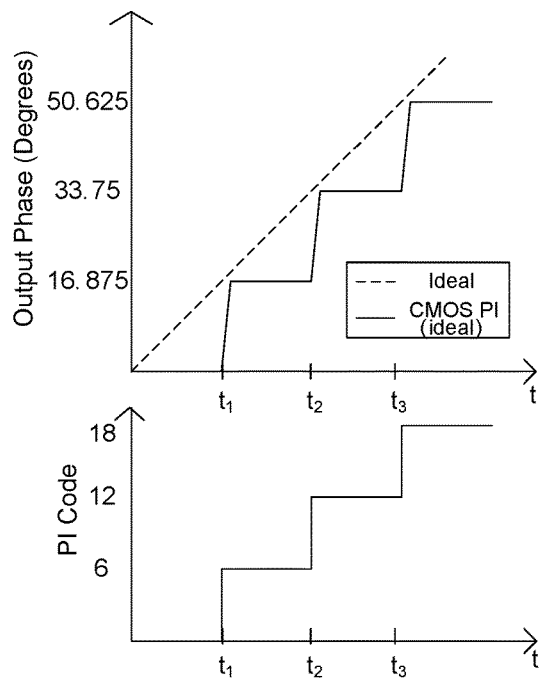
FIG. 7 is a diagram showing an output phase as a function of changes in a phase interpolator code.
Figure 8:
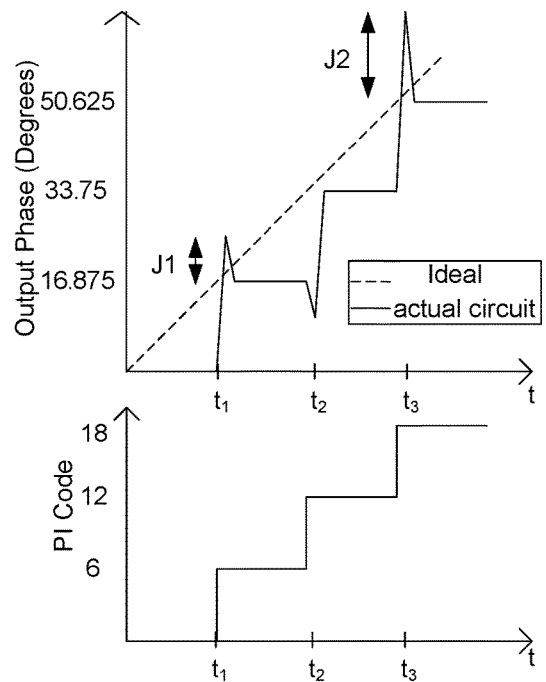
FIG. 8 is another diagram showing an output phase as a function of changes in a phase interpolator code.

Turning now to FIGS. 7 and 8, diagrams show an output phase as a function of changes in a phase interpolator code. FIGS. 7 and 8 show the PI transfer function, where the horizontal axis displays time and vertical axis displays clock phase delay. An ideal transfer function is plotted in FIG. 7 in dotted line, where phase delay is linear between any two codes. In a CMOS PI, any phase shift is instantaneous and would result in a jump in the transfer function, as depicted in the solid line of FIG. 7. Although the magnitude can be predicted, such a jump is considered period jitter (PJ) as compared to the linear transfer function. However, in a real circuit implementation, additional phase jitter that is unintended would present itself during code changes, due to circuit architecture or mismatch in physical implementation as shown in FIG. 8. The amount of this unintended jitter relates to at least two factors. The first is the size of each code step, and the second is a result of any glitch introduced by clock source switching. As shown in FIG. 8, additional jitter during code 12-to-18 jump (i.e. J2) at time t3 is larger than from 0-to-6 jump (i.e. J1) at time $t_1$, due to an boundary crossing from one octant to another (16 is one of the boundary codes) necessitating a change in clock source. While a bigger step size results in a larger expected period jitter, it also means the next code would be more likely to be further away from a boundary, which means the interpolation buffer that is receiving the glitch clock will have a larger driving strength and thus have a bigger impact on the period jitter.

Figure 9:
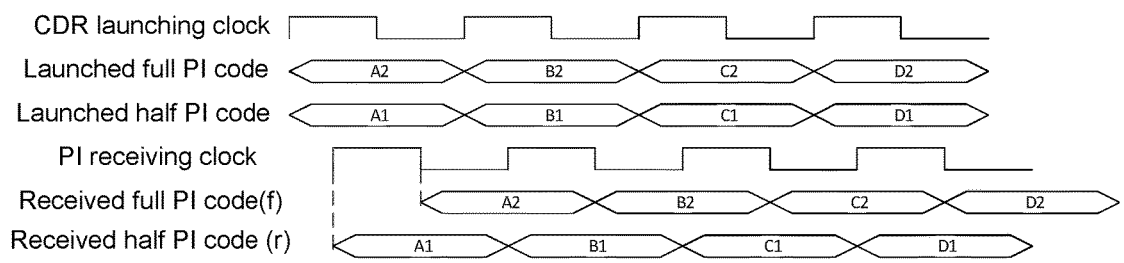
FIG. 9 is a timing diagram showing the application of full and half phase interpolator codes.

Turning now to FIG. 9, a timing diagram shows the application of full and half phase interpolator codes. In conventional devices, a CDR circuit sends one PI code in one CDR clock cycle (i.e. a rising edge of a clock to the next rising edge of the clock). In contrast, according to the various implementations set forth below, the CDR circuit sends two PI codes in one CDR clock cycle. As shown in FIG. 9, the CDR circuit sends the two PI codes along with CDR clock on rising edge. The PI captures a first code (designated as the half code) using rising edge of receiving clock and then may capture a second code (designated as the full code) on falling edge of the receiving clock, where the half code and the full code are a part of a single clock cycle.

According to some implementations, the CDR circuit computes the next code by adding a delta code to the current code. The delta code can be used according to different methods of reducing the period jitter by determining if and what PI code to apply during the middle of the clock cycle (i.e. at a falling edge, where the clock cycle is defined as extending from a rising edge to a next rising edge). According to the first method, the delta code is divided by two, and half of the phase adjustment is executed in first half cycle and the other half of the phase adjustment is executed in second half. According to a second method, the phase boundary crossing condition is monitored when changing from a current code to a next code, and in the case of boundary crossing, the boundary code is executed first before the next code. Both methods have the advantage of reducing the intended jitter (i.e. jitter due to step size) and unintended jitter (i.e. jitter due to boundary crossing).

Figure 10:
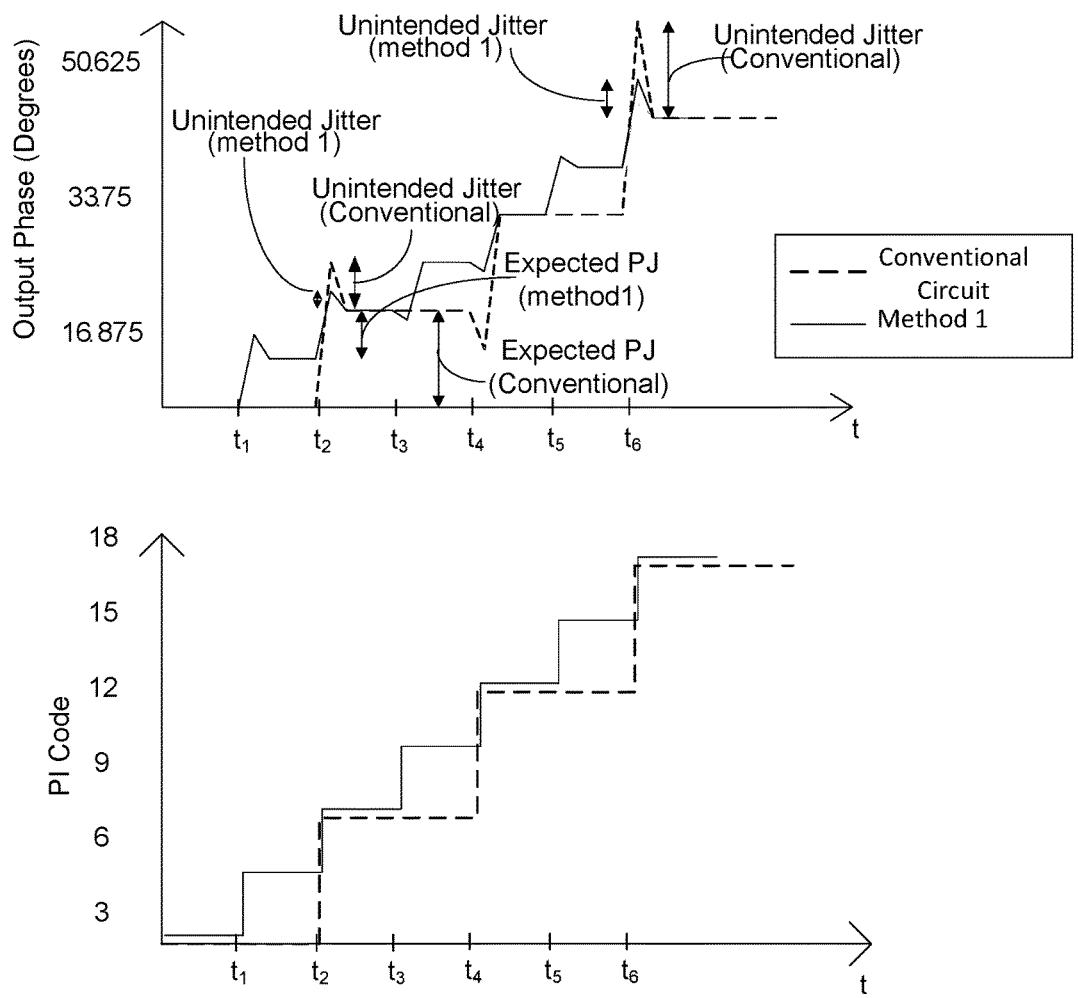
FIG. 10 is a timing diagram showing the generation of phase interpolator codes according to a first method.

Turning now to FIG. 10, a timing diagram shows the generation of phase interpolator codes according to the first method of dividing the delta code associated with a PI code. The first method reduces the step size by half and thus reduces the mean period jitter by half. FIG. 10 illustrates a PI transfer function in solid line and compares it with conventional transfer function in dotted line. By way of example, during code transition from 12 to 18 the boundary code 16 is crossed and the step size is 6. In a binary representation, this will be from 000 1100 to 001 0010, and the boundary code is 001 0000. According to the first method, the delta code is 6, and half of the delta code is 3. The CDR will then send a PI code of 12+3=15 to be captured in PI during the first half cycle and a PI code of 12+6=18 in the second half cycle. In binary, that is, 000 1100 000 1111 001 0010. To compute the next code, one could simply implement the following in RTL: for half code: next code=current code+(delta code/2), while for full code: next code=current code+delta code. As is apparent in FIG. 10, the unintended jitter using method 1 of dividing the delta code associated with the PI code is significantly reduced compared to a conventional method of changing the PI code only once in a clock cycle at both time t2 and at timer t3 (where the unintended jitter is larger when boundary code 16 is crossed.

Figure 11:
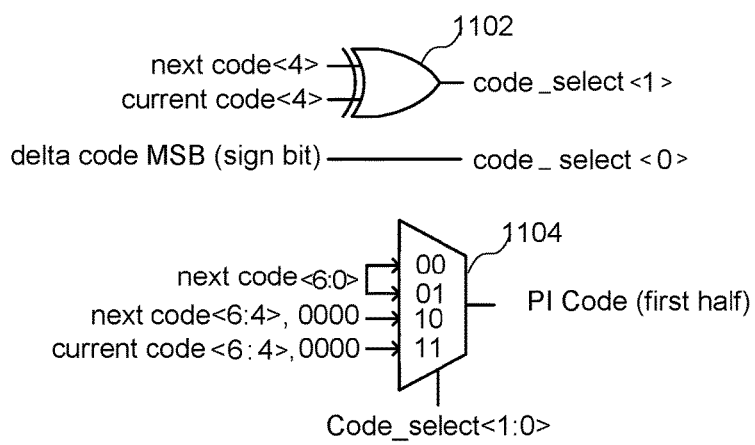
FIG. 11 is a block diagram of circuits for generating a phase interpolator code.

The block diagram of FIG. 11 show circuits for generating a phase interpolator code according to a second method. An exclusive OR gate 1102 is coupled to receive both the next code (next code<4>) signal and the current code (current code<4>) signal to generate a code select signal, where a most significant bit of a delta code (i.e. the sign bit of the delta code) is used as a bit of the code select (code_select<0>) signal. The code_select<1:0> is used as a selection signal for selecting a next code (next code <6:0>) or a portion of a next code or a current code (i.e. next code <6:4> or current code <6:4>) as a first half of a PI code generated at the output of the multiplexer.

According to one implementation, the PI code would have 7 bits and bits <6:4> are for octant selection, while bits <3:0> are for finer phase selection within an octant. Any change in bit <4> from current code to next code indicates the code transition will cross exactly one octant boundary, assuming no change in bits <6:5>. The delta code is a signed binary code indicating the direction and size of the next step. Therefore code_select<1> denotes change in octant and code_select<0> represents the direction of the octant change. As shown in Table. 1, a selection signal for the multiplexer circuit 1104 of FIG. 11 can be generated according to various conditions of the circuit.

TABLE 1

| Input | Selection<1:0> | Function |
| --- | --- | --- |
| next code<6:0> | 00 | If there is no boundary crossing, send next code as the half code |
| next code<6:0> | 01 | same as above |
| next code<6:4>, 0000 | 10 | If there is boundary crossing in positive direction(increment), send next boundary code as the half code |
| current code<6:4>, 0000 | 11 | If there is boundary crossing in negative direction(decrement), send current boundary code as the half code |

The current code is what has been there previously and next is the new code, and therefore the end point is always next code. The multiplexer 1104 of FIG. 11 is for generating a PI code at a half step, and provides a mid-step (in this case a half step) in case of a boundary crossing. For 00 and 01, there's no boundary crossing; so, the entire next code can propagate. That is, the PI code does not change at the half step. Entries 10 and 11 are provided for when there is boundary crossing, and depends on whether the direction is positive or negative. Code_select<0> is 1 if the direction is negative. For example, suppose current code is 010 0111 (39) and next code is 001 1000 (24). The direction is negative; so, the mux select is 11. The mid code derives the MSB from current code; so, 010 0000 (32). If the direction is positive and there is a boundary crossing, the MSB is from the next code. In above example, if next code is 011 1000 (56), the mid code is 011 0000 (48). An example describing a previous cycle and a current cycle is shown in the following Table 2.

TABLE 2

|  | Previous Cycle | Rising Edge of the Cycle (half code) | Falling Edge of this cycle (full code) |
| --- | --- | --- | --- |
| If 12 -> (boundary change) | 12 | 16 | 26 |
| If 1 -> 15 (no boundary change) | 1 | 15 | 15 |

It should be noted that the method as described above is limited to one-boundary crossing, the circuit could be implemented to detect multiple-boundary crossing.

Figure 12:
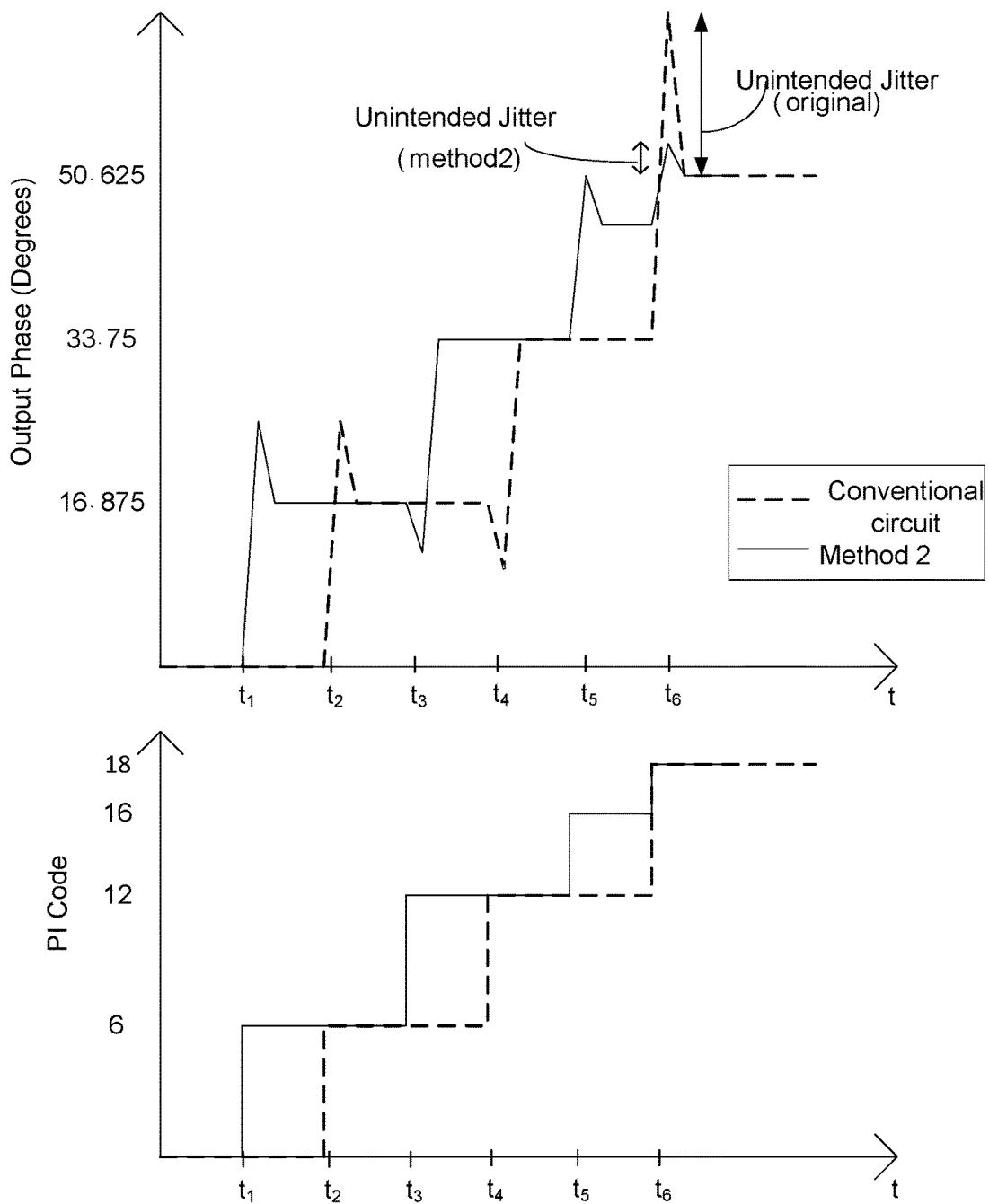
FIG. 12 is a timing diagram showing the generation of phase interpolator codes according to a second method.

The timing diagram of FIG. 12 shows the generation of phase interpolator codes according to the second method, which addresses boundary crossing scenarios, as depicted in FIG. 12, where the modified transfer function has smaller PJ during code jump from 12 to 18 by providing a half code when the next code crosses a boundary crossing. According to the second method, a CDR circuit may detect a boundary crossing by an XOR of the 4th bit of current code and next code. If these two bits are different, this code jump will cross an octant boundary. In this case, the boundary code will be sent in the first half CDR cycle and next code to be sent in second half (e.g. 000 1100 001 0000 001 0010). It should be noted that unintended jitter may not be fully eliminated, but reduced. Unintended jitter due to octant crossing should be almost eliminated. What remains may be due to many code steps within an octant, which is highly implementation specific. The first method set forth above with respect to FIGS. 9-10 has the advantage that the mid code step is calculated precisely, thus making the step sizes equal. For example, if current is 000 1111 (15) and next is 001 1111 (31), the mid step for method 1 would be 001 0111 (23). On the other hand, the mid code for method 2 would be 001 0000 (32). Method 2 described in FIGS. 11-12 is advantageous if the boundary crossing is a problem for the circuit implementation. For example, as the code goes from 000 1010 (10) to 001 0101 (21), if arrival times between coarse (MSB) and fine (LSB) control bits are different, spurious glitches outside 10·21 may appear at the output, for example, 001 1010 (26). Method 2 is more robust against these spurious glitches.

Figure 13:
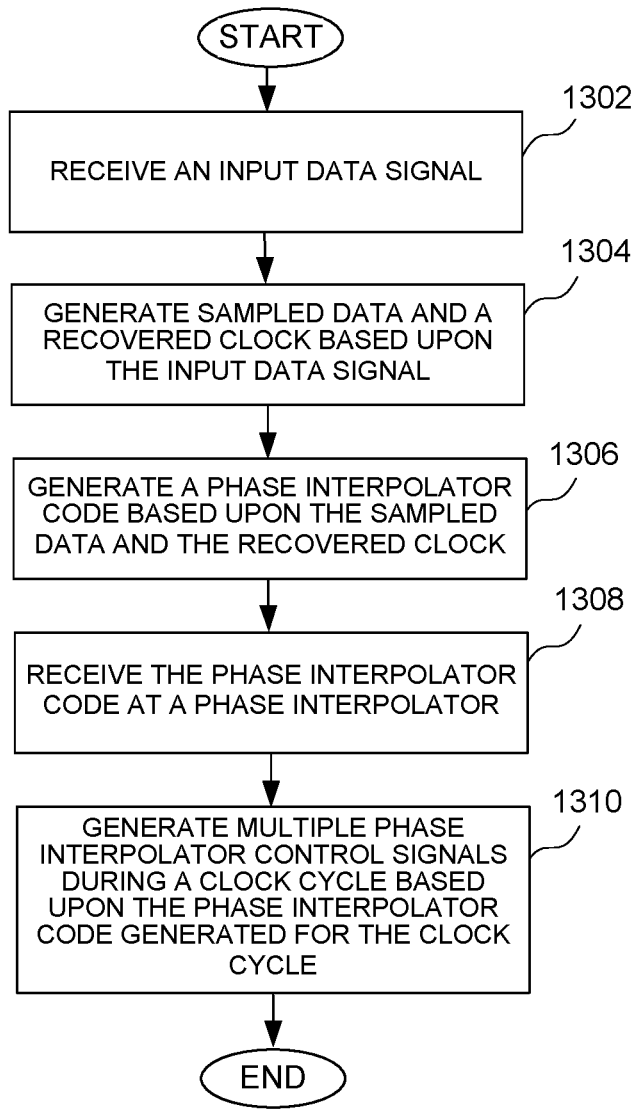
FIG. 13 is a flow diagram showing a method of receiving a signal in an integrated circuit.

Turning now to FIG. 13, a flow diagram shows a method of receiving a signal in an integrated circuit. According to one implementation, a method of receiving a signal in an integrated circuit comprises receiving an input data signal at a block 1302. Sampled data and a recovered clock is generated based upon the input data signal at a block 1304. A phase interpolator code is also generated based upon the sampled data and the recovered clock at a block 1306. The phase interpolator code is also received at a phase interpolator at a block 1308. Multiple phase interpolator control signals are generated during a clock cycle based upon the phase interpolator code generated for the clock cycle at a block 1310.

According to some implementations, receiving the phase interpolator code may comprise receiving a phase selection signal and a weighting signal. Further, generating the multiple phase interpolator control signals may comprise generating a first phase interpolator control signal associated with a first half of a clock cycle and generating a second phase interpolator control signal associated with a second half of a clock cycle. The method may further comprise calculating the second phase interpolator control signal based upon the first phase interpolator control signal and code for a previous clock cycle. The multiple phase interpolator control signals may comprise a code associated with a first phase interpolator control signal applied during a first half of the clock cycle being changed by a first half of a code change, and the multiple phase interpolator control signals comprise a code associated with a second phase interpolator control signal applied during a second half of the clock cycle being changed by a second half of the code change.

The method may further comprise changing a code associated with a first phase interpolator control signal applied during a first half of the clock cycle is changed half of the code change and changing a code associated with a second phase interpolator control signal applied during a second half of the clock cycle is changed half of the code change.

For example, a code associated with a first phase interpolator control signal applied during a first half of the clock cycle half of the code change and a code associated with a second phase interpolator control signal applied during a second half of the clock cycle half of the code change may be based upon a comparison of a current code and a next code. That is, the next code may the same as the current code if there is no boundary crossing. The method may further comprise sending the current code as the next code for the second phase interpolator control signal if the boundary crossing is in a positive direction and the next code is sent as the next code if the boundary crossing is in a negative direction.

The various elements of the method of FIG. 13 may be implemented using the circuits of FIGS. 1-12 as described, or using some other suitable circuits. While specific elements of the method are described, it should be understood that additional elements of the method, or additional details related to the elements, could be implemented according to the disclosure of FIGS. 1-12.

It can therefore be appreciated that new circuits for and methods of receiving a signal in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for receiving a signal in an integrated circuit, the circuit comprising:
 a sampler configured to receive an input data signal, wherein the sampler generates sampled data and a receiver output clock;
 a clock and data recovery circuit configured to receive the sampled data and the receiver output clock and to generate a first phase interpolator code and a second phase interpolator code; and
 a phase interpolator configured to receive the first phase interpolator code and the second phase interpolator code;
 wherein the phase interpolator generates a first phase interpolator control signal and second phase interpolator control signal during a clock cycle based upon the first phase interpolator code and the second phase interpolator code generated for the clock cycle; and
 wherein the sampler receives, from the phase interpolator, a first recovered clock signal based upon the first phase interpolator control signal and a second recovered clock signal based upon the second phase interpolator control signal.

2. The circuit of claim 1, wherein each of the first phase interpolator control signal and the second phase interpolator control signal comprises a phase selection signal and a weighting signal.

3. The circuit of claim 1, wherein the first phase interpolator control signal is associated with a first half of the clock cycle and the second phase interpolator control signal is associated with a second half of the clock cycle.

4. The circuit of claim 3, wherein the first phase interpolator control signal is determined based upon the second phase interpolator control signal.

5. The circuit of claim 1, wherein the phase interpolator determines a change in the first phase interpolator code from a first clock cycle to a second clock cycle, and generating the first phase interpolator control signal and the second phase interpolator control signal for the clock cycle comprises applying, in the middle of the clock cycle, the second phase interpolator code that comprises the first phase interpolator code adjusted by a portion of the change in the first phase interpolator code.

6. The circuit of claim 5, wherein the second phase interpolator code comprises the first phase interpolator code adjusted by one half of the change in the first phase interpolator code from the first clock cycle to the second clock cycle.

7. The circuit of claim 1, wherein the second phase interpolator control signal generated during the clock cycle is based upon a comparison of bits of a current phase interpolator code and a next phase interpolator code.

8. The circuit of claim 7, wherein the second phase interpolator control signal generated during the clock cycle is based upon the next phase interpolator code if no boundary crossing is detected.

9. The circuit of claim 7, wherein the second phase interpolator control signal generated during the clock cycle is based upon the next phase interpolator code if a boundary crossing in a positive direction is detected.

10. The circuit of claim 7, wherein the second phase interpolator control signal generated during the clock cycle is based upon the current phase interpolator code if a boundary crossing in a negative direction is detected.

11. A method of receiving a signal in an integrated circuit, the method comprising:
receiving an input data signal;
generating sampled data and a receiver output clock based upon the input data signal;
generating a first phase interpolator code and a second phase interpolator code based upon the sampled data and the receiver output clock;
receiving the first phase interpolator code and the second phase interpolator code at a phase interpolator;
generating a first phase interpolator control signal and a second phase interpolator control signal during a clock cycle based upon the first phase interpolator code and the second phase interpolator code generated for the clock cycle; and
receiving, at a sampler, a first recovered clock signal based upon the first phase interpolator control signal and a second recovered clock signal based upon the second phase interpolator control signal.

12. The method of claim 11, wherein receiving the first phase interpolator code and the second phase interpolator code at a phase interpolator comprises receiving a phase selection signal and a weighting signal.

13. The method of claim 11, wherein generating the first phase interpolator control signal and the second phase interpolator control signal comprises generating the first phase interpolator control signal associated with a first half of the clock cycle and the second phase interpolator control signal associated with a second half of the clock cycle.

14. The method of claim 13, wherein the first phase interpolator control signal is determined based upon the second phase interpolator control signal.

15. The method of claim 11, further comprising determining a change in the first phase interpolator code from a first clock cycle to a second clock cycle, wherein generating the first phase interpolator control signal and the second phase interpolator control signal during the clock cycle comprises applying, in the middle of the clock cycle, the second phase interpolator code that comprises the first phase interpolator code adjusted by a portion of the change in the first phase interpolator code.

16. The method of claim 15, wherein the second phase interpolator code comprises the first phase interpolator code adjusted by one half of the change in the first phase interpolator code from the first clock cycle to the second clock cycle.

17. The method of claim 11, wherein generating the second phase interpolator control signal during the clock cycle comprises generating the second phase interpolator control signal based upon a comparison of bits of a current phase interpolator code and a next phase interpolator code.

18. The method of claim 17, wherein generating the second phase interpolator control signal during the clock cycle comprises generating the second phase interpolator control signal based upon the next phase interpolator code if no boundary crossing is detected.

19. The method of claim 17, wherein generating the second phase interpolator control signal during the clock cycle comprises generating the second phase interpolator control signal based upon the next phase interpolator code if a boundary crossing in a positive direction is detected.

20. The method of claim 17, wherein generating the second phase interpolator control signal during the clock cycle comprises generating the second phase interpolator control signal based upon the current phase interpolator code in a boundary crossing if a negative direction is detected.

\* \* \* \* \*